US012796000B2

(12) United States Patent
Jung et al.

(10) Patent No.: US 12,796,000 B2
(45) Date of Patent: Nov. 10, 2026

(54) SEMICONDUCTOR DEVICE

(71) Applicant: SAMSUNG ELECTRONICS CO., LTD., Suwon-si (KR)

(72) Inventors: Sujin Jung, Suwon-si (KR); Jinbum Kim, Suwon-si (KR); Dahye Kim, Suwon-si (KR); Ingyu Jang, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 812 days.

(21) Appl. No.: 18/130,070

(22) Filed: Apr. 3, 2023

(65) Prior Publication Data

US 2023/0395684 A1 Dec. 7, 2023

(30) Foreign Application Priority Data

Jun. 2, 2022 (KR) ........................ 10-2022-0067366

(51) Int. Cl.

*H10D 30/67* (2025.01)
*H10D 30/43* (2025.01)
*H10D 62/10* (2025.01)

(52) U.S. Cl.

CPC ......... *H10D 30/6735* (2025.01); *H10D 30/43* (2025.01); *H10D 30/6757* (2025.01); *H10D 62/121* (2025.01)

(58) Field of Classification Search

CPC . B82Y 10/00; H01L 21/76805; H01L 23/485; H10D 30/014; H10D 30/43;

(Continued)

(56) References Cited

U.S. PATENT DOCUMENTS

| | | | |
|---|---|---|---|
| 10,079,305 | B2 | 9/2018 | Lee et al. |
| 10,944,009 | B2 | 3/2021 | Wang et al. |

(Continued)

FOREIGN PATENT DOCUMENTS

| | | |
|---|---|---|
| KR | 10-2020-0142158 A | 12/2020 |
| KR | 10-2020-0143988 A | 12/2020 |
| KR | 10-2022-0042081 A | 4/2022 |

OTHER PUBLICATIONS

Communication issued by Korean Patent Office on Nov. 15, 2025 in Korean Patent Application No. 10-2022-0067366.

(Continued)

*Primary Examiner* — Britt Hanley
*Assistant Examiner* — Kevin Quinto
(74) *Attorney, Agent, or Firm* — Sughrue Mion, PLLC

(57) ABSTRACT

A semiconductor device is provided. The semiconductor device includes: an active region extending in a first direction on a substrate, a plurality of channel layers spaced apart from each other in a vertical direction, a gate structure enclosing the plurality of channel layers, respectively, and a source/drain region contacting the plurality of channel layers. The source/drain region includes a first epitaxial layer extending to contact the plurality of channel layers, and a second epitaxial layer on the first epitaxial layer. A surface in which the first epitaxial layer and the second epitaxial layer contact each other includes: first surfaces having a first slope; second surfaces having a second slope, different from the first slope; first bent portions between the first surfaces and the second surfaces; and a second bent portion in which the second surfaces meet.

20 Claims, 17 Drawing Sheets

(58) Field of Classification Search
CPC ........... H10D 30/6713; H10D 30/6735; H10D 30/6757; H10D 30/797; H10D 62/121; H10D 62/151; H10D 62/405; H10D 62/822; H10D 62/832; H10D 64/017; H10D 64/256; H10D 84/834; H10W 20/083; H10W 20/40
See application file for complete search history.

(56) References Cited

U.S. PATENT DOCUMENTS

| | | | | |
|---|---|---|---|---|
| 11,158,727 | B2 | 10/2021 | Wang et al. | |
| 11,264,485 | B2 | 3/2022 | Wang et al. | |
| 2011/0147842 | A1* | 6/2011 | Cappellani | H10D 64/017<br>257/E29.264 |
| 2016/0087104 | A1* | 3/2016 | Lee | H10D 30/024<br>257/192 |
| 2018/0090583 | A1* | 3/2018 | Choi | H01L 21/76855 |
| 2020/0105876 | A1* | 4/2020 | Ting | H10D 62/822 |
| 2021/0028281 | A1* | 1/2021 | Kim | H10D 30/6212 |
| 2021/0104616 | A1 | 4/2021 | Su et al. | |
| 2021/0167218 | A1 | 6/2021 | Wang et al. | |
| 2021/0217860 | A1 | 7/2021 | Ha et al. | |
| 2022/0037340 | A1 | 2/2022 | Yang et al. | |
| 2022/0069092 | A1 | 3/2022 | Min et al. | |
| 2022/0069134 | A1 | 3/2022 | Kim et al. | |
| 2022/0069135 | A1 | 3/2022 | Chu et al. | |

OTHER PUBLICATIONS

Communication dated Aug. 3, 2026 issued by the Korean Ministry of Intellectual Property in Korean Patent Application No. 10-2022-0067366.

* cited by examiner

SEMICONDUCTOR DEVICE

CROSS-REFERENCE TO RELATED APPLICATION

This application claims priority to Korean Patent Application No. 10-2022-0067366, filed on Jun. 2, 2022, in the Korean Intellectual Property Office, the disclosure of which is incorporated by reference herein in its entirety.

BACKGROUND

The present disclosure relates to a semiconductor device.

As demand for high performance, high speed, and multifunctionality of semiconductor devices increases, semiconductor devices need to be increasingly integrated. In this regard, it is necessary to implement patterns having a fine width or a fine distance. However, the width or the distance may be limited due to operating characteristics of the components. In addition, in order to overcome the limitations of operating characteristics due to the size reduction of planar metal oxide semiconductor field-effect transistors (MOSFETs), efforts are being made to develop semiconductor devices including FinFETs having a three-dimensional (3D) channel structure.

SUMMARY

One or more example embodiments provide a semiconductor device having improved electrical characteristics.

According to an aspect of an example embodiment, a semiconductor device includes: an active region extending in a first direction on a substrate; a plurality of channel layers on the active region and spaced apart from each other along a vertical direction, perpendicular to an upper surface of the substrate; a gate structure extending in a second direction, crossing the active region and the plurality of channel layers on the substrate and enclosing the plurality of channel layers, respectively; and a source/drain region on the active region on at least one side of the gate structure, and contacting the plurality of channel layers. The source/drain region includes a first epitaxial layer on the active region and extending to contact the plurality of channel layers, and a second epitaxial layer, the first epitaxial layer extending between the plurality of channel layers and the second epitaxial layer. At least a portion of a surface in which the first epitaxial layer and the second epitaxial layer are in contact with each other has first surfaces and second surfaces that face different directions. The gate structure includes a lower gate portion, a middle gate portion on the lower gate portion, and an upper gate portion on the middle gate portion in a region overlapping the plurality of channel layers along the vertical direction. A lower end of the second epitaxial layer is disposed on a level substantially equal to or lower than a level of a lower surface of the lower gate portion of the gate structure along the vertical direction. The first epitaxial layer includes an upper portion on a level corresponding to a level of a center between an upper surface and a lower surface of the upper gate portion, a middle portion on a level corresponding to a level of a center between an upper surface and a lower surface of the middle gate portion, and a lower portion on a level corresponding to a level of a center between an upper surface and the lower surface of the lower gate portion. Each of the upper, middle and lower portions has a horizontal length in the first direction, and a maximal horizontal length of the lower portion along the first direction is greater than a maximal horizontal length of each of the upper portion and the middle portion along the first direction.

According to an aspect of an example embodiment, a semiconductor device includes: an active region extending in a first direction on a substrate; a plurality of channel layers arranged on the active region and spaced apart from each other along a vertical direction, perpendicular to an upper surface of the substrate; a gate structure extending in a second direction, crossing the active region and the plurality of channel layers on the substrate, and enclosing the plurality of channel layers, respectively; and a source/drain region on the active region on at least one side of the gate structure and contacting the plurality of channel layers. The source/drain region includes a first epitaxial layer on the active region and extending to contact the plurality of channel layers, and a second epitaxial layer, the first epitaxial layer extending between the plurality of channel layers and the second epitaxial layer. A surface in which the first epitaxial layer and the second epitaxial layer contact each other includes: first surfaces having a first slope; second surfaces extending from lower portions of the first surfaces and having a second slope, different from the first slope; first bent portions between the first surfaces and the second surfaces; and a second bent portion in which the second surfaces meet. The second surfaces have a (111) crystal plane.

According to an aspect of an example embodiment, a semiconductor device includes: an active region extending in a first direction on a substrate; a plurality of channel layers on the active region and spaced apart from each other along a vertical direction, perpendicular to an upper surface of the substrate; a gate structure extending in a second direction, crossing the active region and the plurality of channel layers on the substrate, and enclosing the plurality of channel layers, respectively; and a source/drain region on the active region on at least one side of the gate structure and contacting the plurality of channel layers. The gate structure includes a plurality of gate portions overlapping the plurality of channel layers along the vertical direction and spaced apart from each other along the vertical direction. The source/drain region includes a first epitaxial layer on the active region and extending to contact the plurality of channel layers, and a second epitaxial layer, the first epitaxial layer extending between the plurality of channel layers and the second epitaxial layer. At least a portion of a surface in which the first epitaxial layer and the second epitaxial layer are in contact with each other each other has a (111) crystal plane. The first epitaxial layer includes epitaxial portions that correspond to the plurality of gate portions. Along the first direction, a widest epitaxial portion, among the epitaxial portions, is a lowermost epitaxial portion. A maximum width of the lowermost epitaxial portion in the first direction is in the range of about 11 nm to about 15 nm.

BRIEF DESCRIPTION OF DRAWINGS

The above and other aspects and features will be more apparent from the following description of example embodiments, taken in conjunction with the accompanying drawings, in which.

DETAILED DESCRIPTION

Hereinafter, example embodiments will be described with reference to the accompanying drawings. Each example embodiment provided in the following description is not excluded from being associated with one or more features of another example or another example embodiment also provided herein or not provided herein but consistent with the present disclosure. It will be understood that when an element or layer is referred to as being “on,” “connected to” or “coupled to” another element or layer, it can be directly on, connected or coupled to the other element or layer, or intervening elements or layers may be present. By contrast, when an element is referred to as being “directly on,” “directly connected to” or “directly coupled to” another element or layer, there are no intervening elements or layers present. Expressions such as “at least one of,” when preceding a list of elements, modify the entire list of elements and do not modify the individual elements of the list. For example, the expression, “at least one of a, b, and c,” should be understood as including only a, only b, only c, both a and b, both a and c, both b and c, or all of a, b, and c.

Figure 1:
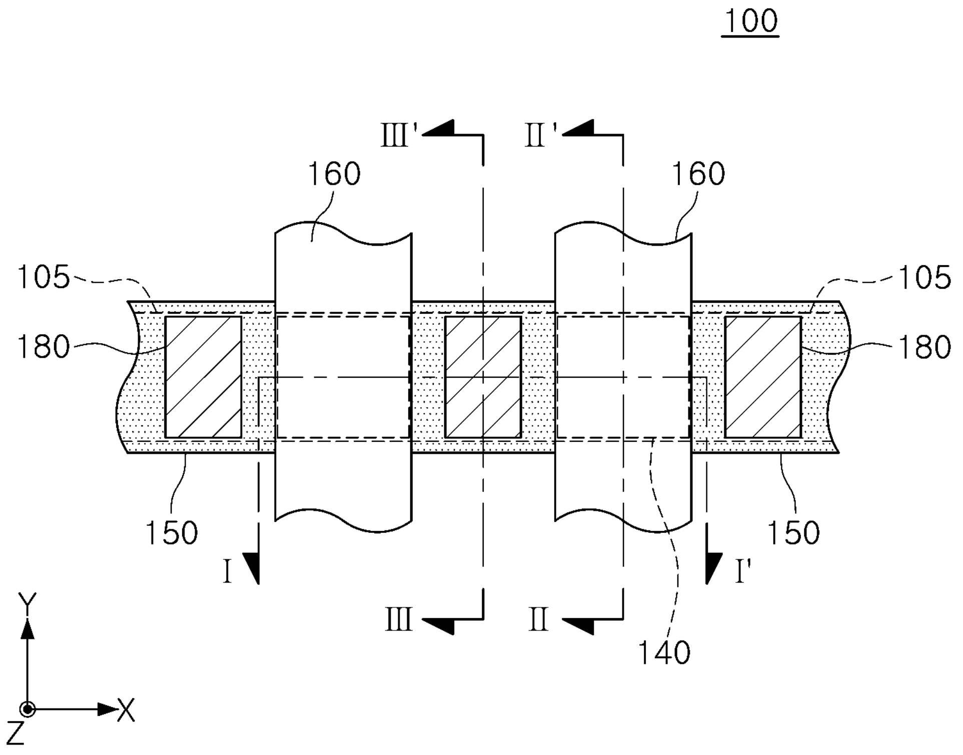
FIG. 1 is a plan view illustrating a semiconductor device according to example embodiments.

FIG. 1 is a plan view illustrating a semiconductor device according to example embodiments.

Figure 2A:
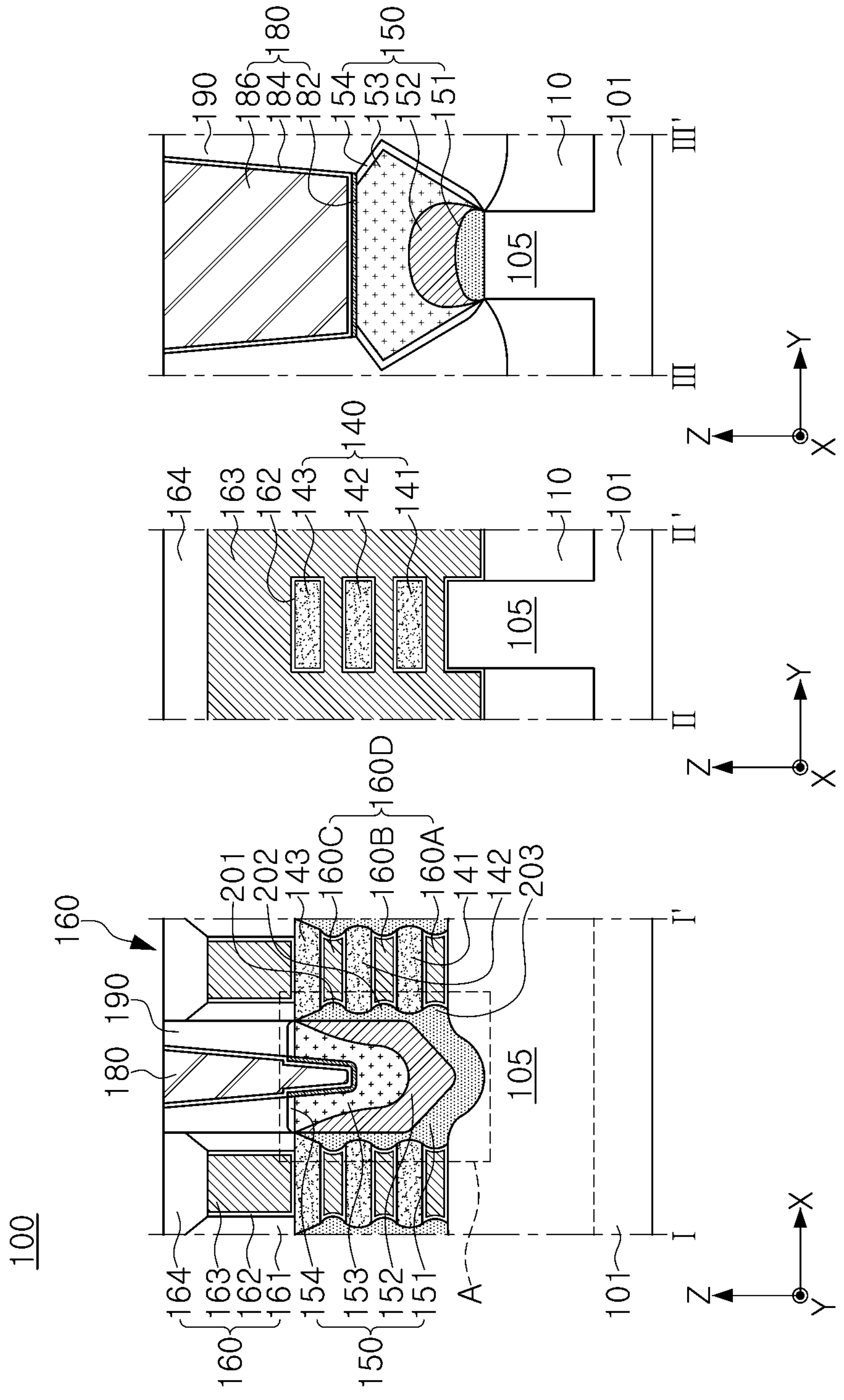
FIG. 2A is a cross-sectional view illustrating a semiconductor device according to example embodiments.

FIG. 2A is a cross-sectional view illustrating a semiconductor device according to example embodiments. FIG. 2A illustrates cross-sections of the semiconductor device of FIG. 1 taken along lines I-I', II-II', and III-III', respectively.

Figure 2B:
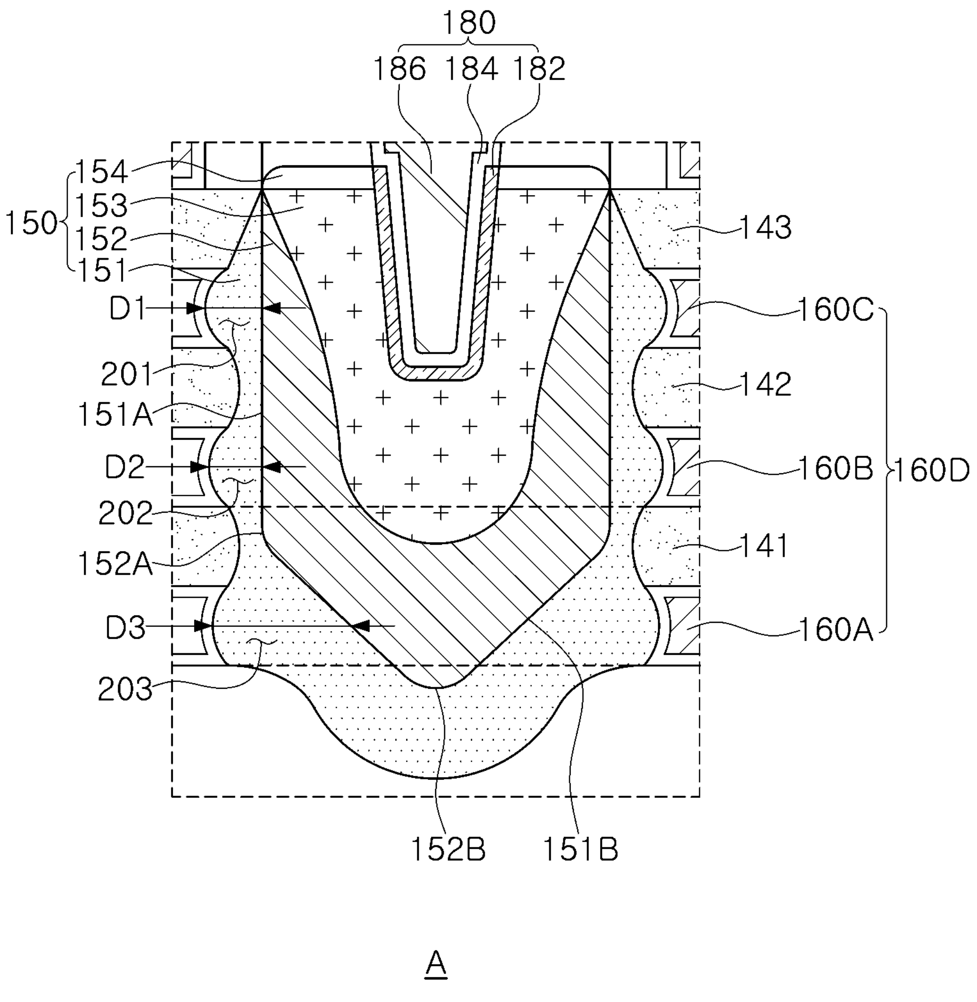
FIG. 2B is a partially enlarged view illustrating a portion of a semiconductor device according to example embodiments.

FIG. 2B is a partially enlarged view illustrating a portion of a semiconductor device according to example embodiments. FIG. 2B illustrates enlarged area ‘A’ of FIG. 2A For convenience of description, only some components of the semiconductor device are illustrated in FIGS. 1 to 2B.

Referring to FIGS. 1 to 2B, a semiconductor device 100 may include a substrate 101, an active region 105 on the substrate 101, a channel structure 140 including a plurality of channel layers 141, 142, and 143 disposed to be vertically spaced apart from each other on the active region 105, a source/drain region 150 in contact with the plurality of channel layers 141, 142, and 143, a gate structure 160 extending across the active region 105, and a contact plug 180 connected to the source/drain region 150. The semiconductor device 100 may further include device isolation layers 110 and an interlayer insulating layer 190. The gate structure 160 may include a spacer layer 161, a gate dielectric layer 162, a gate electrode layer 163, and a gate capping layer 164.

In the semiconductor device 100, the active region 105 has a fin structure, and the gate electrode layer 163 may be disposed between the active region 105 and the channel structure 140, between the plurality of channel layers 141, 142, and 143 of the channel structures 140, and on the channel structure 140. Accordingly, the semiconductor device 100 may include a gate-all-around type field effect transistor formed by the channel structure 140, the source/drain region 150, and the gate structure 160, that is, a multi-bridge channel field effect transistor (MBCFET™). The transistor may be, for example, a PMOS transistor.

The substrate 101 may have an upper surface extending in an X-direction and the Y-direction. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOT) layer, a semiconductor on insulator (SeOI) layer, or the like.

The device isolation layer 110 may define the active region 105 in the substrate 101. The device isolation layer 110 may be formed by, for example, a shallow trench isolation (STI) process. In some example embodiments, the device isolation layer 110 may further include a region having a step below the substrate 101 and extending more deeply. The device isolation layer 110 may partially expose an upper portion of the active region 105. In some example embodiments, the device isolation layer 110 may have a curved upper surface having a level higher level toward the active region 105. The device isolation layer 110 may be formed of an insulating material. The device isolation layer 110 may be, for example, oxide, nitride, or combinations thereof.

The active region 105 is defined by the device isolation layer 110 in the substrate 101 and may be disposed to extend in the first direction, for example, the X-direction. The active region 105 may have a structure protruding from the substrate 101. An upper end of the active region 105 may be protrude from the upper surface of the device isolation layer 110 to have a predetermined height. The active region 105 may be formed as a portion of the substrate 101 or may include an epitaxial layer grown from the substrate 101. On both sides of the gate structure 160, the active region 105 on the substrate 101 may be partially recessed, and the source/drain region 150 may be disposed in the recessed active region 105. The active region 105 may include impurities or may include doped regions including impurities.

The channel structure 140 may include the first to third channel layers 141, 142, and 143, which are two or more channel layers disposed to be spaced apart from each other in a direction, perpendicular to an upper surface of the active region 105, for example, in the Z-direction, on the active region 105. The first to third channel layers 141, 142, and 143 may be spaced apart from the upper surface of the active region 105, while being connected to the source/drain region 150. The first to third channel layers 141, 142, and 143 may have a width the same as or similar to that of the active region 105 in the Y-direction, and may have a width the same as or similar to that of the gate structure 160 in the X-direction. However, in some example embodiments, the first to third channel layers 141, 142, and 143 may have a reduced width such that side surfaces thereof are positioned below the gate structure 160 in the X-direction.

The first to third channel layers 141, 142, and 143 may be formed of a semiconductor material, and may include, for example, at least one of silicon (Si), silicon germanium (SiGe), and germanium (Ge). The first to third channel layers 141, 142, and 143 may be formed of, for example, the same material as that of the substrate 101. The number and shape of the plurality of channel layers 141, 142, and 143 constituting one channel structure 140 may be variously changed in example embodiments. For example, in some example embodiments, the channel structure 140 may further include a channel layer disposed on the upper surface of the active region 105.

The source/drain regions 150 may be disposed on the active region 105 at both sides of the channel structure 140. The source/drain region 150 may include a first epitaxial layer 151, a second epitaxial layer 152 disposed on the first epitaxial layer 151, a third epitaxial layer 153 disposed on the second epitaxial layer 152, and a capping layer 153 disposed on the third epitaxial layer 153, disposed alongside surfaces of the first to third channel layers 141, 142, and 143 of the channel structure 140.

The first epitaxial layer 151 may be disposed on the active region 105 and may extend to contact the plurality of channel layers 141, 142, and 143. The first epitaxial layer 151 may contact a lower portion 160D of the gate structure 160 disposed below each of the channel layers 141, 142, and 143.

The first epitaxial layer 151 may include an upper portion 201 on a level substantially the same as a level of a center between an upper surface and a lower surface of an upper gate portion 160C, a middle portion 202 on a level substantially the same as a level of a center between an upper surface and a lower surface of a middle gate portion 160B, and a lower portion 203 on a level substantially the same as a level of a center between an upper surface and a lower surface of a lower gate portion 160A. The first epitaxial layer 151 may include epitaxial portions 201, 202, and 203 disposed on a level that is the same as a level of the plurality of gate portions 160A, 160B, and 160C in the first direction (X-direction). The upper portion 201, the middle portion 202 and the lower portion 203 may be referred to as epitaxial portions 201, 202, and 203, respectively.

In some example embodiments, a side surface of the lower portion 160D of the gate structure 160 in the first direction (X-direction) may be recessed to have a predetermined depth to have an inwardly concave shape. The epitaxial portions 201, 202, and 203 of the first epitaxial layer 151 may be disposed in the recessed region of the lower portion 160D of the gate structure 160. The epitaxial portions 201, 202, and 203 may have horizontal lengths D1, D2, and D3 in a direction, parallel to the upper surface of the substrate 101, respectively. The horizontal lengths D1, D2, and D3 refer to a distance measured in a direction, parallel to the upper surface of the substrate 101 from the most protruding portion, among the respective epitaxial portions 201, 202 and 203 protruding toward the lower portion 160D of the gate structure 160 to a surface in which the first epitaxial layer and the second epitaxial layer are in contact with each other. According to an example embodiment, horizontal lengths D1 and D2 of the upper epitaxial portion 201 and the middle epitaxial portion 202 may be within a range of about 6 nm to about 10 nm. The horizontal length D3 of the lowermost epitaxial portion 203 may be within a range of about 11 nm to about 15 nm. The horizontal length D3 of the lowermost epitaxial portion 203 may be greater than the horizontal lengths D1 and D2 of the upper epitaxial portion 201 and the middle epitaxial portion 202. For example, a difference between the horizontal length D3 of the lowermost epitaxial portion 203 and the horizontal length D1 of the upper epitaxial portion 201 or a difference between the horizontal length D3 of the lowermost epitaxial portion 203 and the horizontal length D2 of the middle epitaxial portion 202 may be within a range of about 2 nm to about 9 nm. As a result, a distance between the second epitaxial layer 152 of the source/drain region 150 and the substrate 101 increases, thereby providing a semiconductor device having improved electrical characteristics.

A surface of the first epitaxial layer 151 in contact with the plurality of channel layers 141, 142, and 143 and the lower portion 160D of the gate structure 160 may have a wavy shape but example embodiments are not limited thereto. The shape of the first epitaxial layer 151 may be changed according to the shape of the channel structure 140, the shape of the gate structure 160, and the like. The first epitaxial layer 151 may have an approximately U-shape in a cross-section I-I' along the X-direction, but is not limited thereto. A lower end of the first epitaxial layer 151 may be disposed on a level lower than a level of a lower surface of the lower gate portion 160A.

The second epitaxial layer 152 may be disposed on the first epitaxial layer 151. The second epitaxial layer may have an approximately U-shaped rounded shape, but is not limited thereto. A surface in which the first epitaxial layer 151 and the second epitaxial layer 152 are in contact may include first bent portions 152A, a second bent portion 152B, first inclined surfaces 151A, and second inclined surfaces 151B. The first inclined surfaces 151A and the second inclined surfaces 151B may be referred to as first surfaces 151A and second surfaces 151B, respectively. Each of the first surfaces 151A may have a first slope, and each of the second surfaces 151B may extend from a lower portion of the first surfaces 151A, and may have a second slope, different from the first slope. The first bent portions 152A may be positioned between the first surfaces 151A and the second surfaces 151B, and the second surfaces 151B may meet each other at the second bent portions 152B. A portion of the surface in which the first epitaxial layer 151 and the second epitaxial layer 152 contact may form a surface perpendicular to the substrate 101. For example, among the surfaces in which the first epitaxial layer 151 and the second epitaxial layer 152 contact each other may form a surface perpendicular to the substrate 101. Among the surfaces in which the first epitaxial layer 151 and the second epitaxial layer 152 contact each other, each of the second surfaces 151B may have a (111) crystal plane.

According to an example embodiment, the first bent portions 152A may be disposed on a level lower than that of the lower surface of the middle gate portion 160B, and the second bent portion 152B may be disposed on a level lower than that of the lower surface of the lower gate portion 160A.

According to an example embodiment, the center portion of the lower gate portion 160A may be disposed between the first bent portions 152A and the second bent portion 152B, but is not limited thereto and may be variously changed according to example embodiments.

The third epitaxial layer 153 may be disposed on the second epitaxial layer 152. The third epitaxial layer 153 may be disposed to fill the recess region of the source/drain region 150.

The capping layer 154 may be disposed on the third epitaxial layer 153. The capping layer 154 may be a protective layer provided on (e.g., capping) the first to third epitaxial layers 151, 152, and 153. At least a portion of the capping layer 154 may be formed on a level higher than that of an upper surface of the uppermost channel layer 143, but example embodiments are not limited thereto.

The first to third epitaxial layers 151, 152, and 153 may include silicon germanium (SiGe) or silicon (Si) doped with a group III element. In example embodiments, the first to third epitaxial layers 151, 152, and 153 may have a p-type conductivity. For example, the first to third epitaxial layers 151, 152, and 153 may include silicon germanium (SiGe), and may include any one of boron (B), aluminum (Al), gallium (Ga), indium (In), and thallium (Tl) as doping elements.

The first to third epitaxial layers 151, 152, and 153 may have different germanium (Ge) concentrations. The Ge concentrations may increase in the order of the first epitaxial layer 151, the second epitaxial layer 152, and the third epitaxial layer 153. For example, the first epitaxial layer 151 may include first silicon germanium (SiGe) including germanium (Ge) having a first concentration, the second epitaxial layer 152 may include a second silicon germanium (SiGe) including germanium (Ge) having a second concentration, higher than the first concentration, and the third epitaxial layer 153 may include a third silicon germanium (SiGe) including germanium (Ge) having a third concentration, higher than the second concentration.

The capping layer 154 may include silicon (Si) doped with a group III element. The capping layer 154 may substantially not include Ge. The capping layer 154 may be a protective layer capping the first to third epitaxial layers 151, 152, and 153.

Because the first to third epitaxial layers 151, 152, and 153 and the capping layer 154 have different material compositions (e.g., the concentration of Ge), the first to third epitaxial layers 151, 152, and 153 and the capping layer 154 may be substantially distinguished from each other through analysis, such as transmission electron microscopy energy-dispersive X-ray spectroscopy (TEM-DES).

The source/drain region 150 may have a circular, elliptical, pentagonal, hexagonal, or similar shape in cross-section in the Y-direction. However, in example embodiments, the source/drain region 150 may have various shapes, for example, any one of a polygonal shape, a circular shape, and a rectangular shape. In addition, as shown in FIG. 2A, the source/drain region 150 has a substantially flat upper surface in cross-section along the X-direction, and may have a stripe shape, a portion of a circle, a portion of an ellipse, or a similar wavy shape to the lower side of the upper surface. However, such a shape may be variously changed in example embodiments according to a distance between the adjacent gate structures 160, a height of the active region 105, and the like.

The source/drain region 150 according to an example embodiment has the structural characteristics described above, and thus, the horizontal length D3 of the lowermost epitaxial portion 203 is greater than the horizontal lengths D1 and D2 of the upper epitaxial portion 201 and the middle epitaxial portion 202. Thus, a distance between the high-concentration second epitaxial layer 152 of the source/drain region 150 and the substrate 101 may be increased. Accordingly, leakage current occurring at the lower portion of the source/drain region 150 may be prevented, and a semiconductor device having improved electrical characteristics may be provided.

The gate structure 160 may be disposed to cross the active region 105 and the channel structures 140 to extend in one direction, for example, the Y-direction on the active region 105 and the channel structures 140. Channel regions of transistors may be formed in the active region 105 and the channel structures 140 crossing the gate structure 160. The gate structure 160 may include a gate electrode layer 163, a gate dielectric layer 162 between the gate electrode layer 163 and the plurality of channel layers 141, 142, and 143, spacer layers 161 on side surfaces of the gate electrode layer 163, and a gate capping layer 164 on the upper surface of the gate electrode layer 163. The gate structure 160 may include a lower gate portion 160A, a middle gate portion 160B on the lower gate portion 160A, and an upper gate portion 160C on the middle gate portion 160B in a region vertically overlapping the plurality of channel layers 141, 142, and 143. The lower gate portion 160A, the middle gate portion 160B on the lower gate portion 160A, and the upper gate portion 160C on the middle gate portion 160B may be spaced apart from each other.

The gate dielectric layer 162 may be disposed between the active region 105 and the gate electrode layer 163, and between the channel structure 140 and the gate electrode layer 163. The gate dielectric layer 162 may be disposed to cover at least a portion of the surfaces of the gate electrode layer 163. For example, the gate dielectric layer 162 may be disposed to surround all surfaces except the top surface of the gate electrode layer 163. The gate dielectric layer 162 may extend between the gate electrode layer 163 and the spacer layers 161, but is not limited thereto. The gate dielectric layer 162 may include oxide, nitride, or high-κ material. The high-κ material may refer to a dielectric material having a higher dielectric constant than that of a silicon oxide layer ($SiO_2$). The high-κ material may be any one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode layer 163 may be disposed to fill a space between the plurality of channel layers 141, 142, and 143 above the active region 105 and extend above the channel structure 140. The gate electrode layer 163 may be spaced apart from the plurality of channel layers 141, 142, and 143 by the gate dielectric layer 162. The gate electrode layer 163 may include a conductive material. For example, the gate electrode layer 163 may include metal nitride, such as titanium nitride (TiN), tantalum nitride (TaN), or tungsten nitride (WN), and/or a metal material, such as aluminum (Al), tungsten (W), or molybdenum (Mo), or a semiconductor material, such as doped polysilicon.

The gate electrode layer 163 may be formed of two or more multilayer structures. The spacer layers 161 may be disposed on both side surfaces of the gate electrode layer 163. The gate spacer layers 161 may insulate the source/drain region 150 from the gate electrode layer 163. The spacer layers 161 may have a multilayer structure according to example embodiments. The spacer layers 161 may include at least one of oxide, nitride, oxynitride, and a low-κ dielectric.

The gate capping layer 164 may be disposed on the gate electrode layer 163, and a lower surface thereof may be surrounded by the gate electrode layer 163 and the spacer layers 161.

The interlayer insulating layer 190 may be disposed to cover the source/drain region 150, the gate structure 160, and the device isolation layer 110. The interlayer insulating layer 190 may include, for example, at least one of oxide, nitride, oxynitride, and a low-κ dielectric.

The contact plug 180 may pass through at least a portion of the interlayer insulating layer 190 to contact the source/drain region 150, and may conduct an electrical signal to the source/drain region 150. The contact plug 180 may be disposed on the source/drain region 150, and may be disposed to have a greater length in the Y-direction than the source/drain region 150 in some example embodiments. The contact plug 180 may have an inclined side surface in which a lower width is narrower than an upper width according to an aspect ratio, but is not limited thereto. The contact plug 180 may be recessed within the source/drain region 150 by a predetermined depth. The contact plug 180 may include a metal-semiconductor compound layer 182 disposed at a lower end, a barrier layer 184 disposed along sidewalls, and a plug conductive layer 186. The metal-semiconductor compound layer 182 may be, for example, a metal silicide layer. The barrier layer 184 may include, for example, a metal nitride, such as a titanium nitride layer (TiN), a tantalum nitride layer (TaN), or a tungsten nitride layer (WN). The plug conductive layer 186 may include, for example, a metal material, such as aluminum (Al), tungsten (W), or molybdenum (Mo). In an example embodiment, the contact plug 180 may be disposed to pass through at least a portion of the source/drain region 150.

Figure 3A:
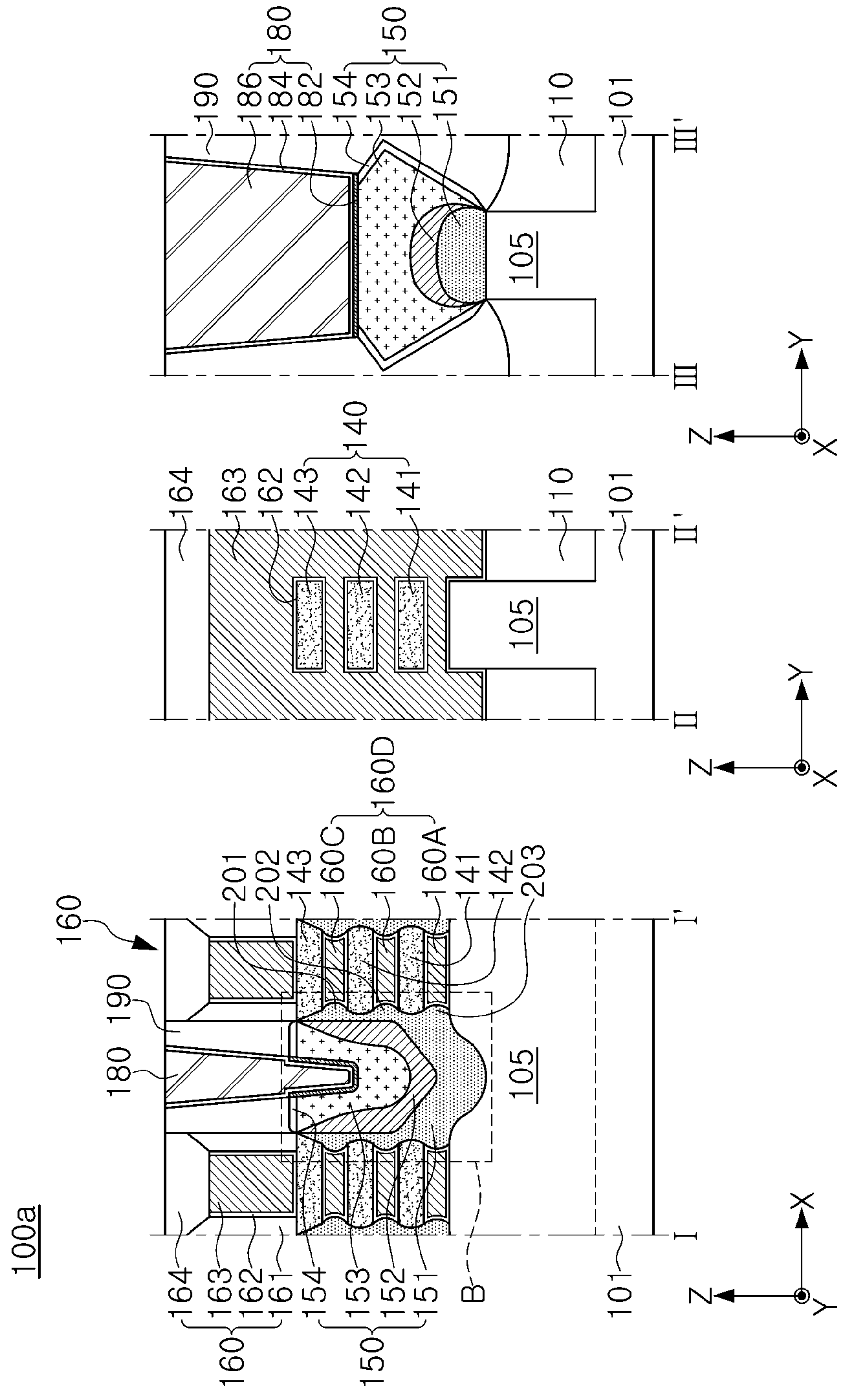
FIG. 3A is a cross-sectional view illustrating a semiconductor device according to example embodiments.

FIG. 3A is a cross-sectional view illustrating a semiconductor device 100*a* according to example embodiments.

Figure 3B:
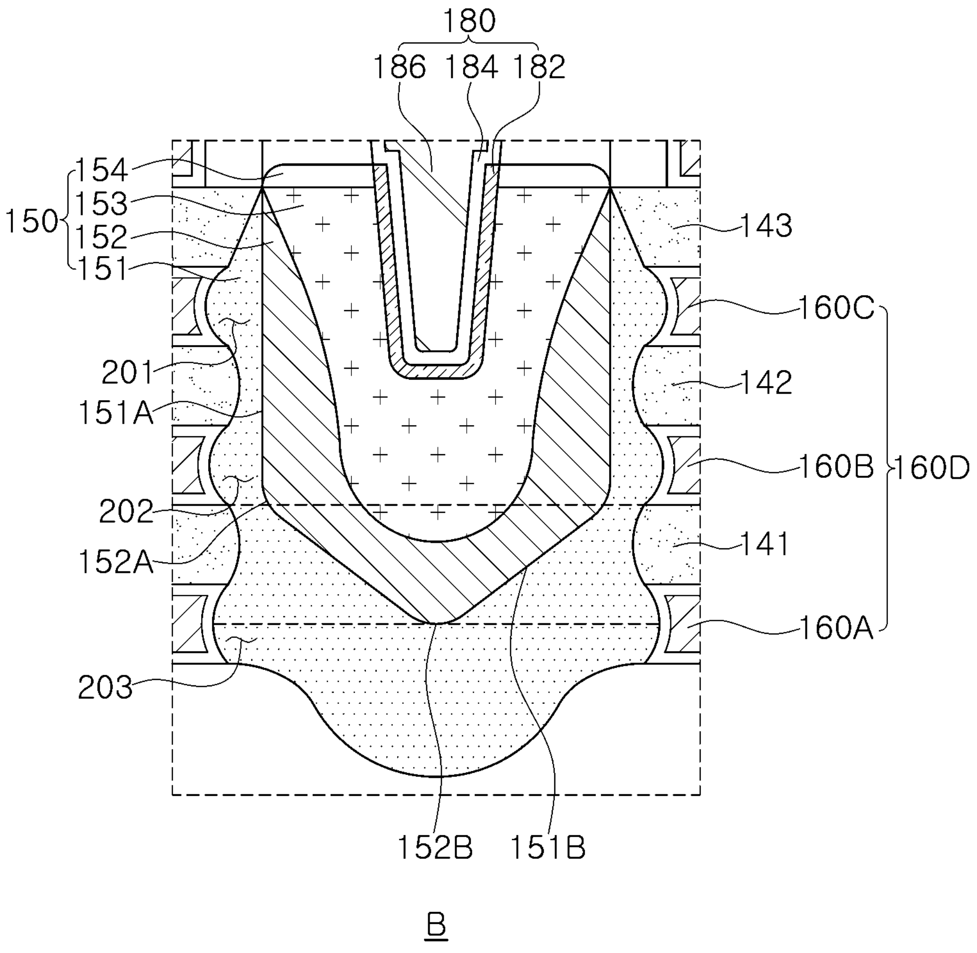
FIGS. 3B, 3C, 3D and 3E are partially enlarged views illustrating a portion of a semiconductor device according to example embodiments.
Figure 3C:
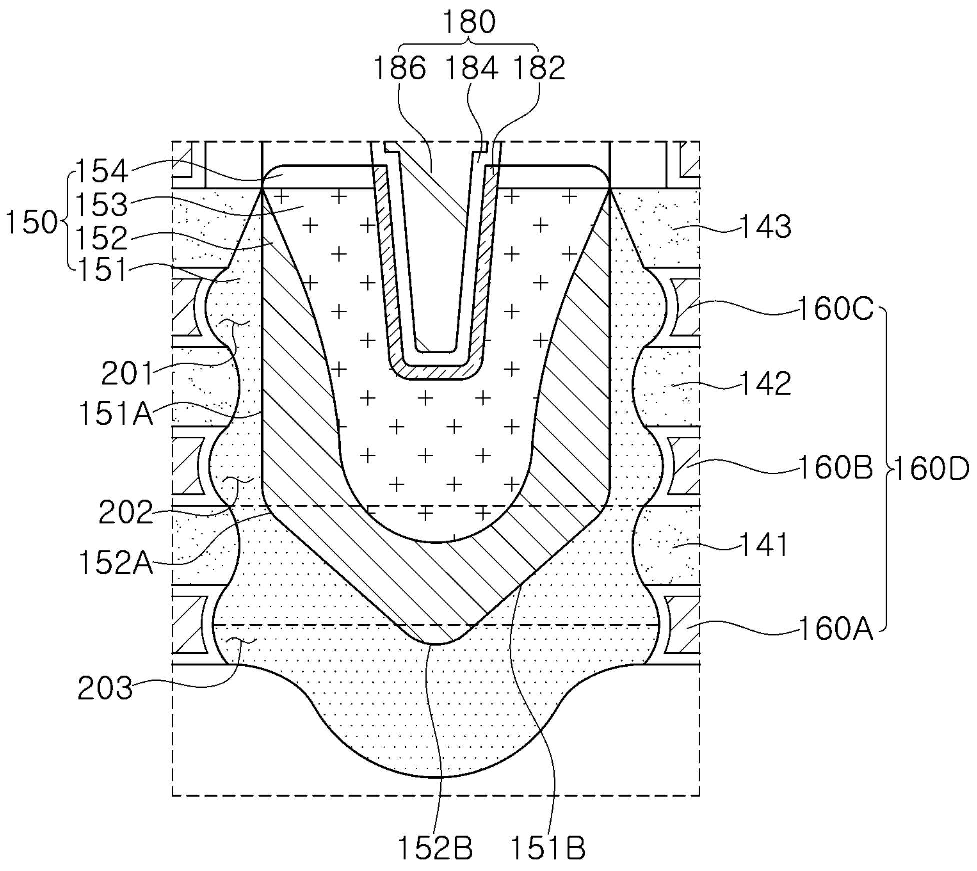
Figure 3D:
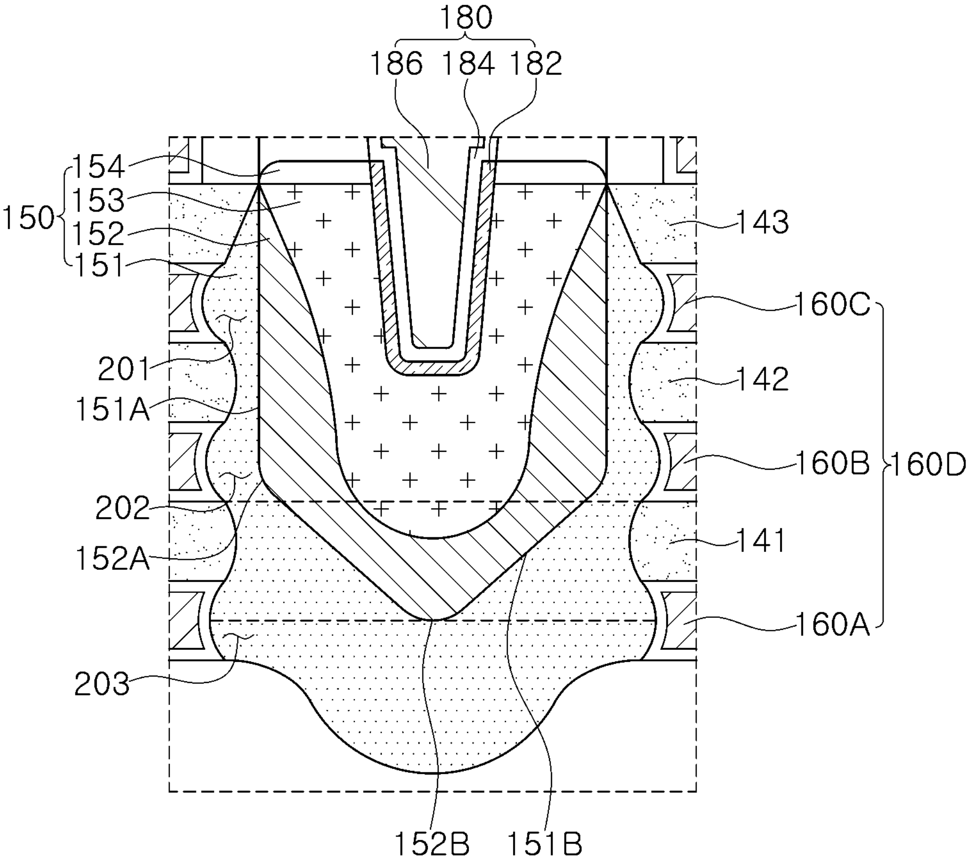
Figure 3E:
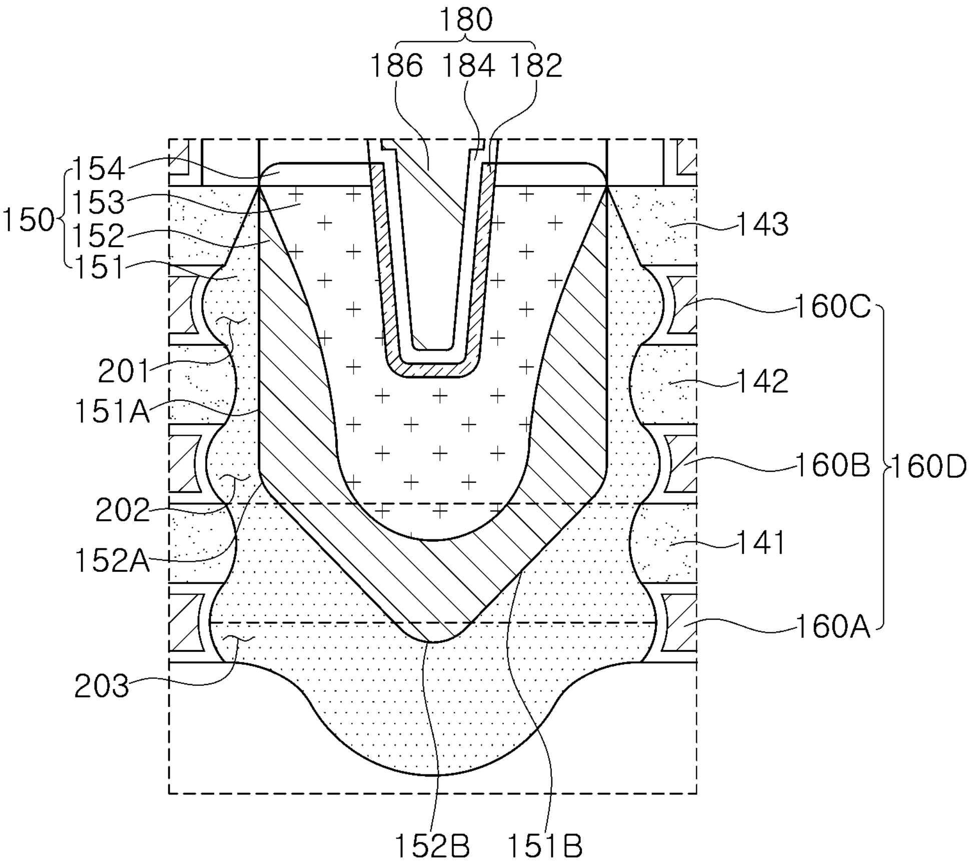

FIGS. 3B to 3E are partially enlarged views illustrating a portion of the semiconductor device 100*a* according to example embodiments. FIG. 3B illustrates an enlarged region 'B' of FIG. 3A. FIGS. 3C to 3E illustrate example embodiments in which the region 'B' of FIG. 3B is modified.

In FIGS. 3A to 3E, the same reference numerals as those of FIG. 2A denote corresponding components, and a redundant description thereof will be omitted.

Referring to FIG. 3A, a structure of the first epitaxial layer 151 of the semiconductor device 100*a* may be formed to be different from the description with respect to FIG. 2A. The region 'B' of FIG. 3A may represent various example embodiments according to levels of first bent portions 152A and second bent portions 152B. FIGS. 3B to 3E are diagrams illustrating a region 'B' of FIG. 3A modified according to various example embodiments.

Referring to FIG. 3B, the first bent portions 152A may be disposed on substantially the same level as that of the lower surface of the middle gate portion 160B, and the second bent portions 152B may be disposed on substantially the same level as that of the center portion of the lower gate portion 160A. The term "substantially" the same in length, etc., may include a case in which a length or the like is completely equal, as well as a case in which there is a slight difference in length, etc., due to an error in the process, etc., despite formation through the same process, and both cases may be interpreted to have the same meaning even when the expression "substantially" is omitted.

Referring to FIG. 3C, first bent portions 152A may be disposed on substantially the same level as that of the center portion of middle gate portion 160B, and the second bent portion 152B may be disposed on a level lower than a level of the upper surface of the lower gate portion 160A.

Referring to FIG. 3D, the first bent portions 152A may be disposed on a level higher than a lower surface of the middle gate portion 160B and lower than a level of a center portion of the middle gate portion 160B, and the second bent portion 152B may be disposed on substantially the same level as that of the upper surface of the lower gate portion 160A.

Referring to FIG. 3E, first bent portions 152A may be disposed on a level higher than a level of the lower surface of the middle gate portion 160B and lower than a level of the center portion of the middle gate portion 160B, and the second bent portion 152B may be disposed on a level lower than a level of the upper surface of the lower gate portion 160A.

FIGS. 4A to 4I are cross-sectional views illustrating a sequential process of a method of manufacturing the semiconductor device 100 according to example embodiments. FIGS. 4A to 4I illustrate an example embodiment of a manufacturing method for manufacturing the semiconductor device 100 of FIGS. 1 to 2A, and illustrate cross-sections corresponding to FIG. 2A.

Figure 4A:
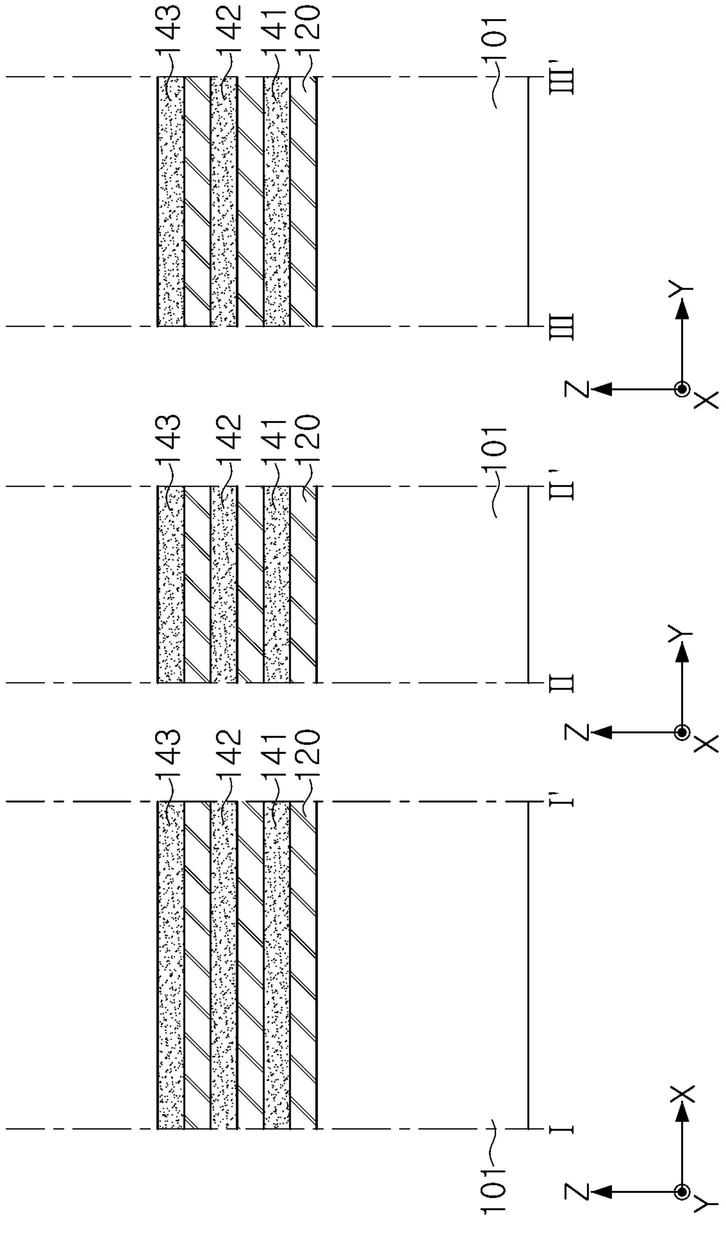
FIGS. 4A, 4B, 4C, 4D, 4E, 4F, 4G, 4H and 4I are cross-sectional views illustrating a process sequence of a method of manufacturing a semiconductor device according to example embodiments.

Referring to FIG. 4A, sacrificial layers 120 and the plurality of channel layers 141, 142, and 143 may be alternately stacked on the substrate 101.

The sacrificial layers 120 may be replaced by the gate dielectric layer 162 and the gate electrode layer 163 as shown in FIG. 2 through a subsequent process. The sacrificial layers 120 may be formed of a material having etch selectivity with respect to the plurality of channel layers 141, 142, and 143. The plurality of channel layers 141, 142, and 143 may include a material different from that of the sacrificial layers 120. In an example embodiment, the plurality of channel layers 141, 142, and 142 may include silicon (Si), and the sacrificial layers 120 may include silicon germanium (SiGe).

The sacrificial layers 120 and the plurality of channel layers 141, 142, and 143 may be formed by performing an epitaxial growth process using the substrate 101 as a seed. Each of the sacrificial layers 120 and the plurality of channel layers 141, 142, and 143 may have a length in a range of about 1 Å to 100 nm. The number of layers of the plurality of channel layers 141, 142, and 143 alternately stacked with the sacrificial layer 120 may be variously changed in example embodiments.

Figure 4B:
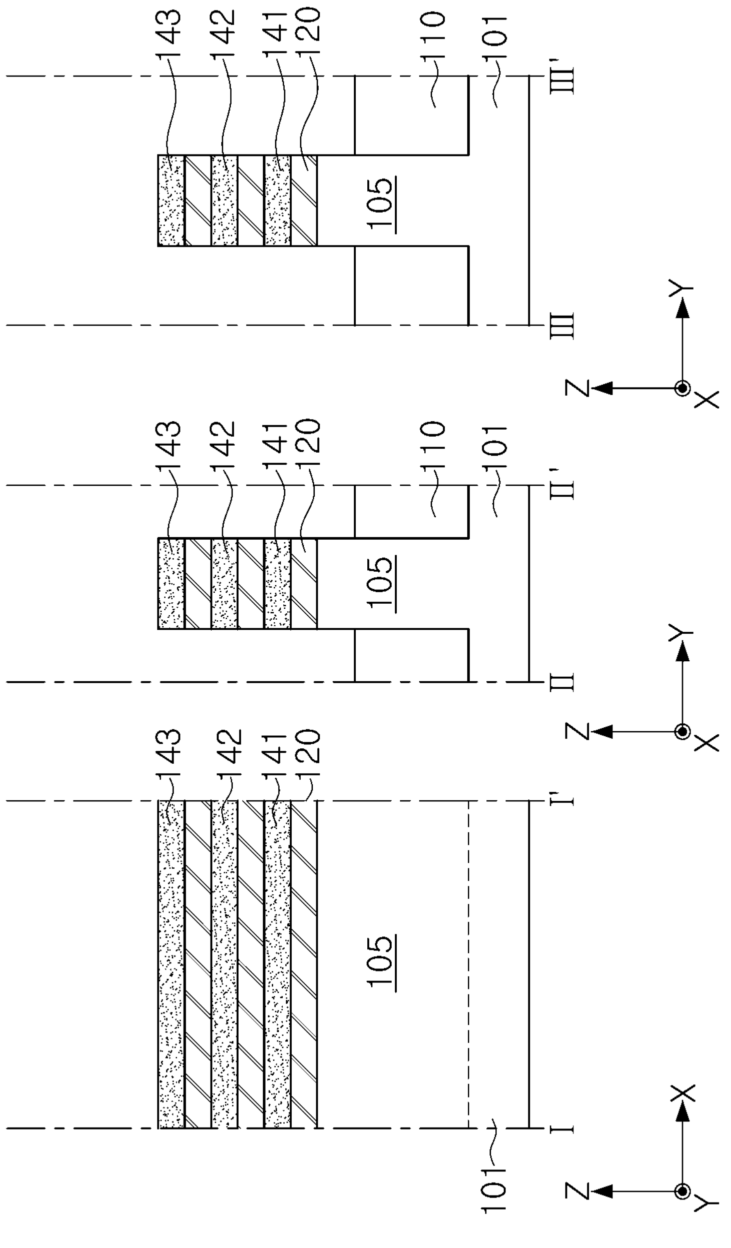

Referring to FIG. 4B, a stack structure of the sacrificial layers 120 and the plurality of channel layers 141, 142, and 143 and a portion of the substrate 101 may be removed to form active structures.

The active structure may include sacrificial layers 120 and a plurality of channel layers 141, 142, and 143 that are alternately stacked with each other, and a portion of the substrate 101 may be removed to form the active region 105 formed to protrude from the upper surface of the substrate 101. The active structures may be formed in a line shape extending in one direction, for example, the X-direction, and may be disposed to be spaced apart from each other in the Y-direction.

The device isolation layers 110 may be formed in the region from which a portion of the substrate 101 is removed by burying an insulating material and then recessing the insulating material so that the active region 105 protrudes from the insulating material. An upper surface of the device isolation layers 110 may be formed to be lower than an upper surface of the active region 105.

Figure 4C:
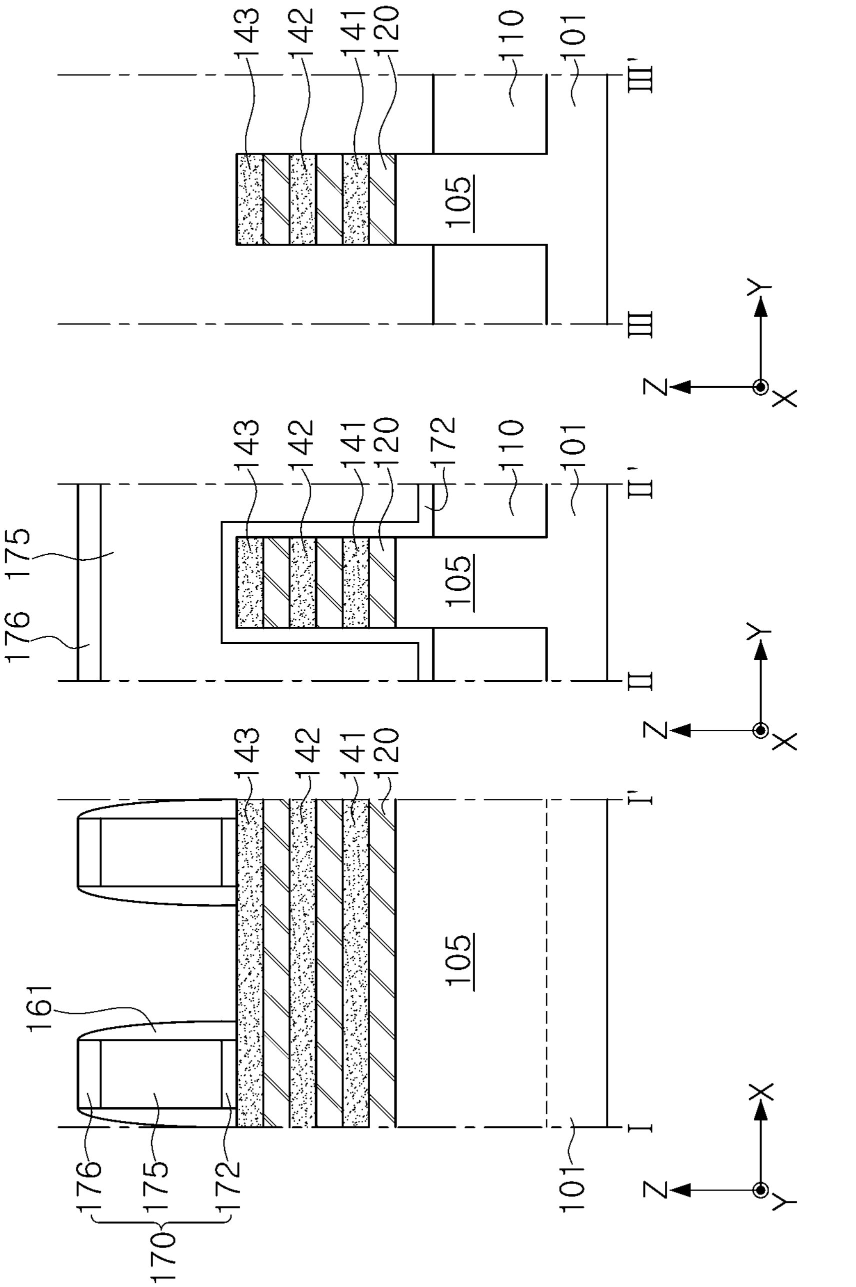

Referring to FIG. 4C, sacrificial gate structures 170 and spacer layers 161 may be formed on the active structures.

The sacrificial gate structures 170 may be sacrificial structures formed in a region in which the gate dielectric layer 162 and the gate electrode layer 163 are disposed on the channel structure 140 through a subsequent process, as shown in FIG. 2A. The sacrificial gate structures 170 may include first and second sacrificial gate layers 172 and 175 and a mask pattern layer 176 that are sequentially stacked. The first and second sacrificial gate layers 172 and 175 may be patterned using a mask pattern layer 176. The first and second sacrificial gate layers 172 and 175 may be an insulating layer and a conductive layer, respectively. For example, the first sacrificial gate layer 172 may include silicon oxide, and the second sacrificial gate layer 175 may include polysilicon. The mask pattern layer 176 may include silicon nitride. The sacrificial gate structures 170 may have a line shape crossing the active structures and extending in one direction. The sacrificial gate structures 170 may extend, for example, in the Y-direction and may be disposed to be spaced apart from each other in the X-direction.

The spacer layers 161 may be formed on both sidewalls of the sacrificial gate structures 170. The spacer layers 161 may be formed by forming a film having a uniform thickness along upper and side surfaces of the sacrificial gate structures 170 and the active structures, and then performing anisotropic etching. The spacer layers 161 may be formed of a low-ic material, and may include, for example, at least one of SiO, SiN, SiCN, SiOC, SiON, and SiOCN.

Figure 4D:
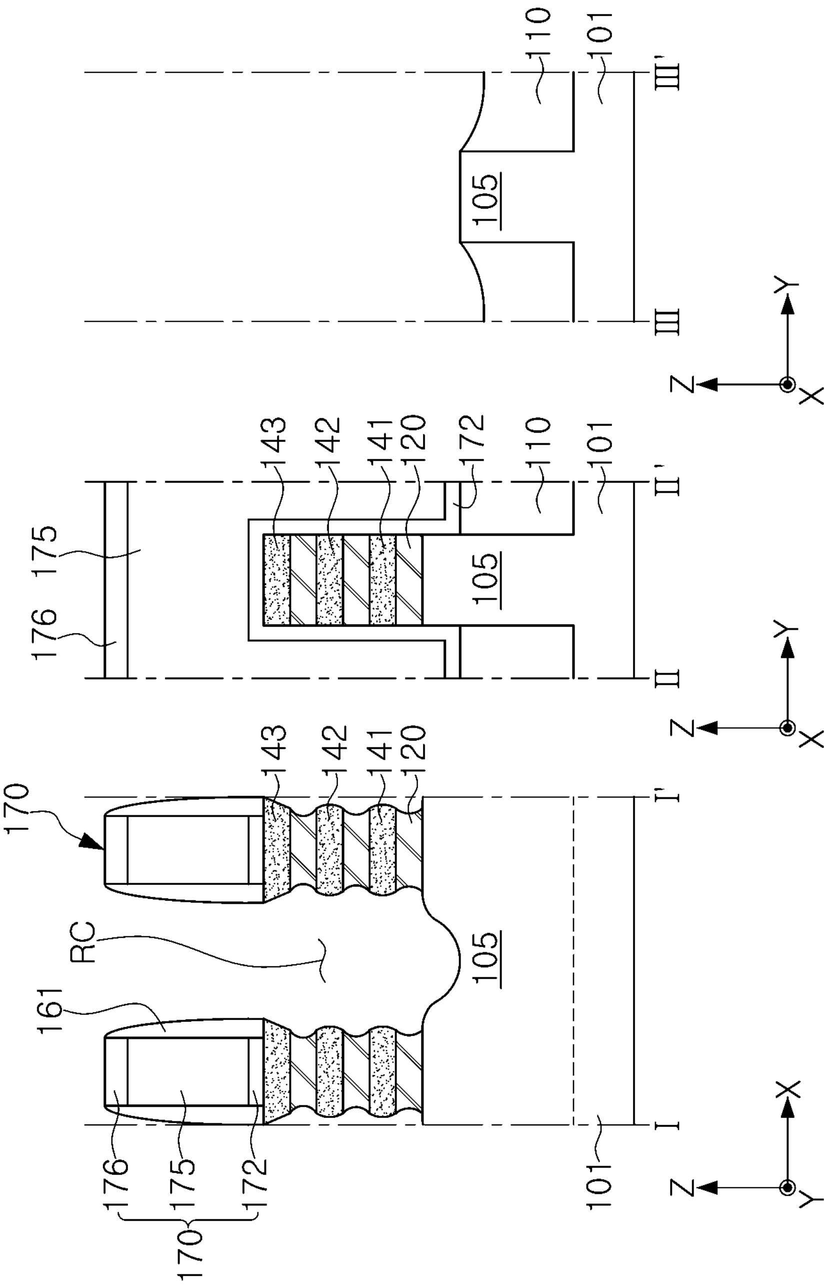

Referring to FIG. 4D, a portion of the active region 105, the sacrificial layers 120 and the plurality of channel layers 141, 142, and 143 exposed between the sacrificial gate structures 170 may be removed to form a recess region RC, thereby forming the channel structures 140.

The exposed sacrificial layers 120 and the plurality of channel layers 141, 142, and 143 may be removed by using the sacrificial gate structures 170 and the gate spacer layers 161 as masks. The remaining sacrificial layers 120 may be selectively etched with respect to the channel structures 140 by, for example, a wet etching process and removed to a predetermined depth from the side surface along the X-direction to have inwardly concave side surfaces. The plurality of remaining channel layers 141, 142, and 143 may have side surfaces etched along the X-direction to have outwardly convex side surfaces. However, the shapes of the side surfaces of the sacrificial layers 120 and the plurality of channel layers 141, 142, and 143 are not limited those that are illustrated. For example, side surfaces of the sacrificial layers 120 and the plurality of channel layers 141, 142, and 143 may be formed to be coplanar in a direction, perpendicular to the upper surface of the substrate 101.

Figure 4E:
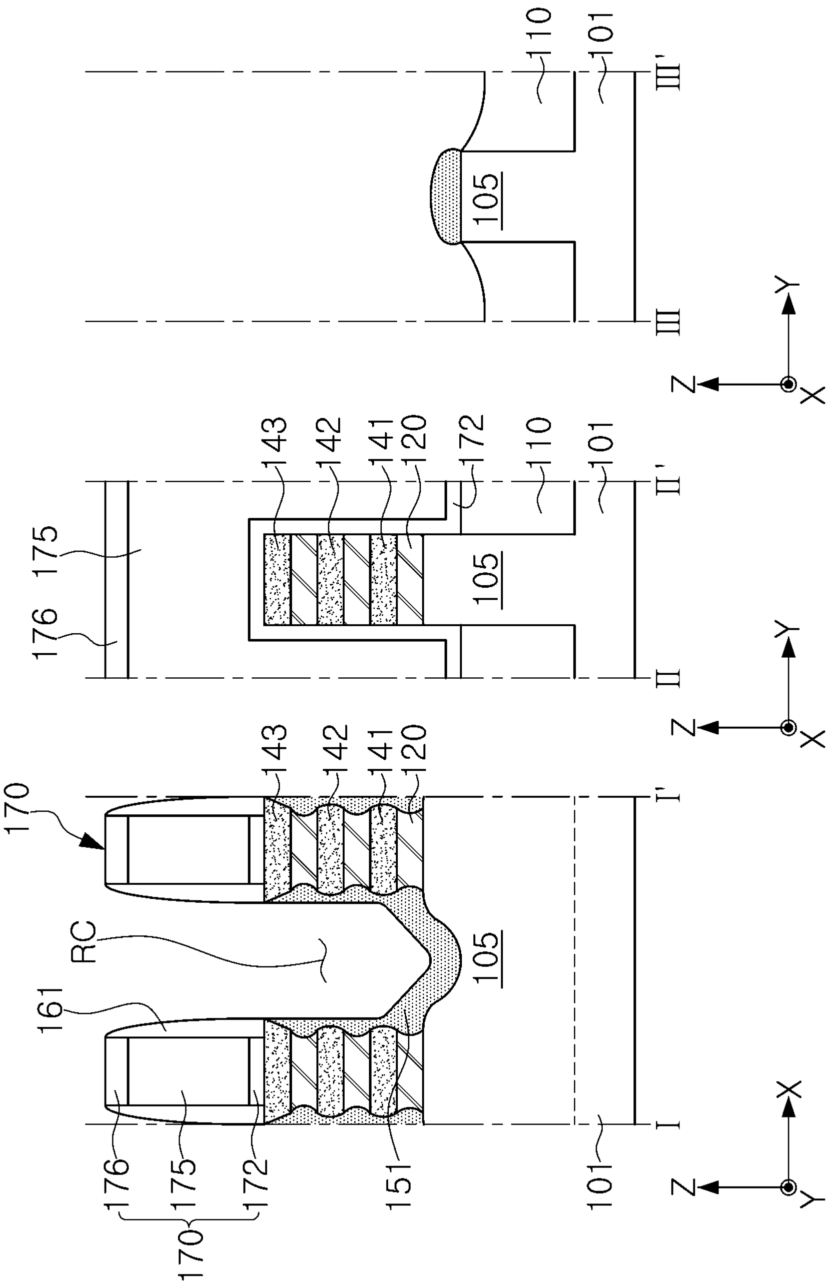

Referring to FIG. 4E, a first epitaxial layer 151 may be formed in the recess region RC.

The source/drain region 150 may be formed by repeating an epitaxial growth process and an etching process. The first epitaxial layer 151 may be formed by repeating epitaxial growth and etching processes and may extend to come into contact with the plurality of channel layers 141, 142, and 143 and the sacrificial layers 120 in the recess region RC. Accordingly, an upper surface of the first epitaxial layer 151 may be formed in a recessed shape, and may be formed to have an approximately U-shape. A surface of the first epitaxial layer 151 in contact with the plurality of channel layers 141, 142, and 143 and the sacrificial layers 120 may have a wavy shape. When the epitaxial growth and etching process are repeated, a side surface among the surfaces of the first epitaxial layer 151 in contact with the second epitaxial layer 152 formed by a subsequent process (refer to FIG. 4F) may be perpendicular to the substrate 101. Among surfaces in contact with the second epitaxial layer 152 formed by a subsequent process (refer to FIG. 4F) with the first epitaxial layer 151, second inclined surfaces 151B may form a (111) crystal plane.

This process may be performed under the conditions in which pressure may be in the range of about 10 Torr to about 100 Torr and a temperature may be in the range of about 600° C. or higher, in order to thicken a lower portion of the first epitaxial layer 151. The first epitaxial layer 152 may include impurities by in-situ doping.

Figure 4F:
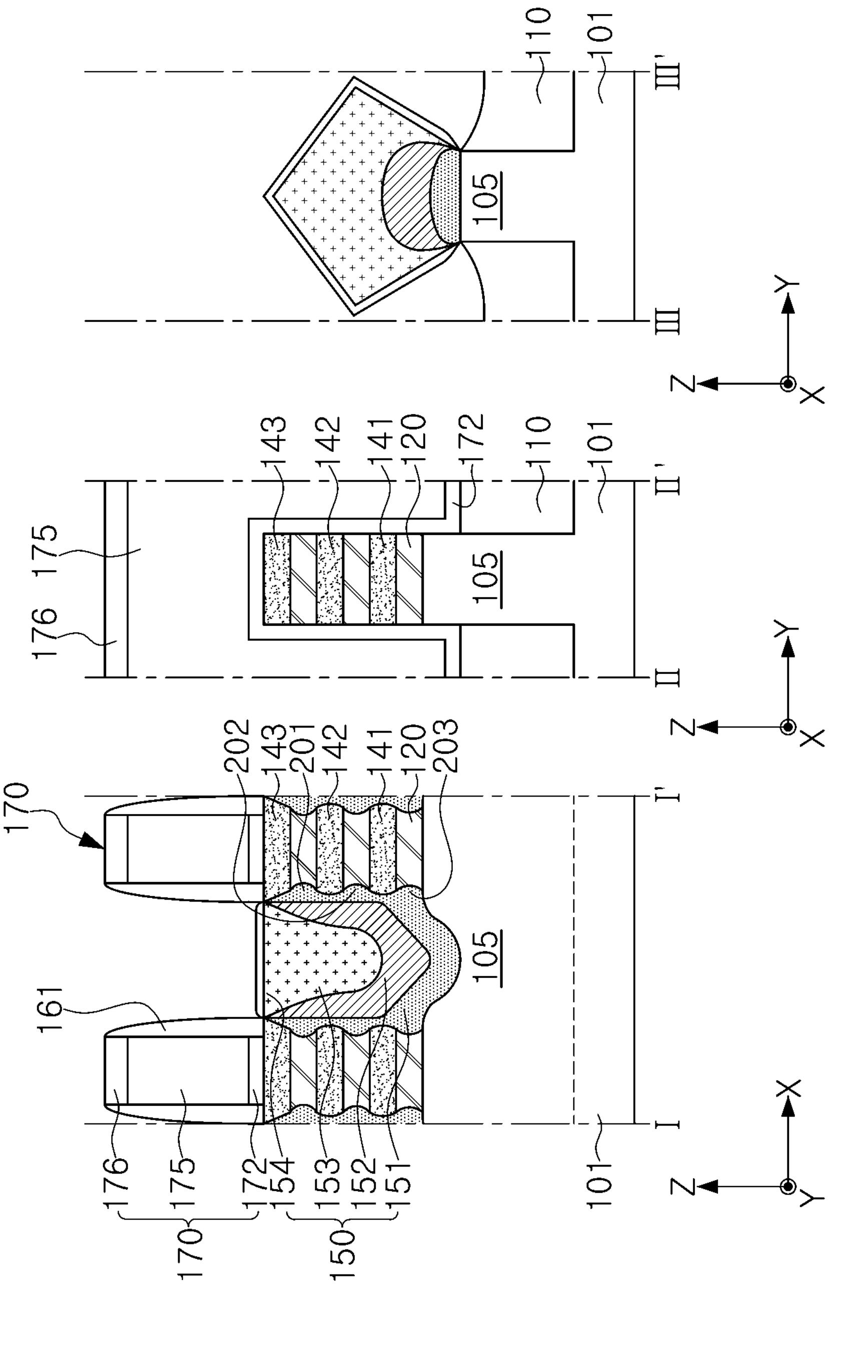

Referring to FIG. 4F, a second epitaxial layer 152, a third epitaxial layer 153, and a capping layer 154 may be formed on the first epitaxial layer 151.

The second epitaxial layer 152 may be formed on an upper surface of the first epitaxial layer 151. Accordingly, the upper surface of the second epitaxial layer 152 may have a recessed shape similar to that of the upper surface of the first epitaxial layer 151. The second epitaxial layer 152 may be formed to cover the entire upper surface of the first epitaxial layer 151, but is not limited thereto.

The second epitaxial layer 152 may include silicon germanium (SiGe) doped with a group III element. According to an example embodiment, the first epitaxial layer 151 may include any one of boron (B), aluminum (Al), gallium (Ga), indium (In), and thallium (Tl). The second preliminary epitaxial layer 152 may include Ge having a higher concentration than that of the first epitaxial layer 151.

Next, the third epitaxial layer 153 may be formed on the second epitaxial layer 152. After the third epitaxial layer 153 is formed, the capping layer 154 may be formed on the third epitaxial layer 153.

Figure 4G:
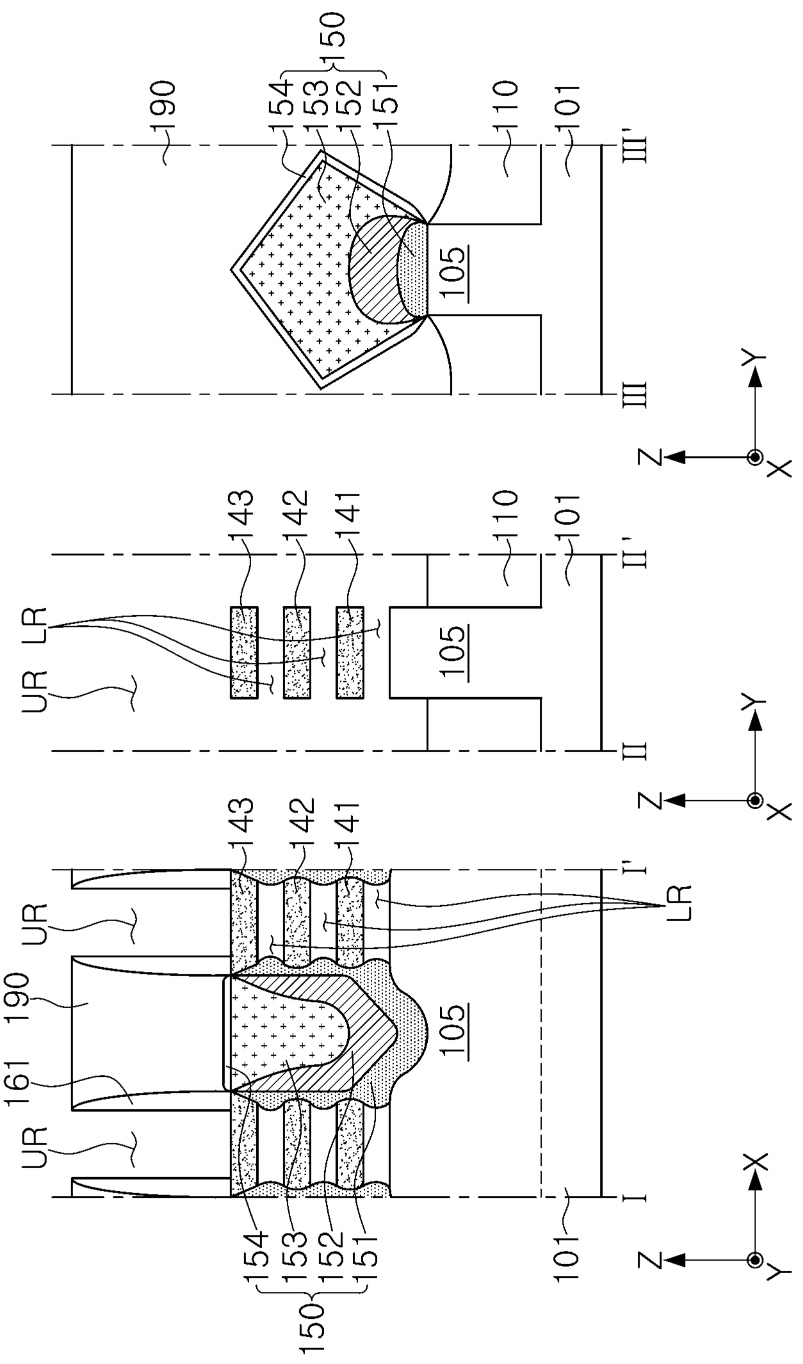

Referring to FIG. 4G, an interlayer insulating layer 190 may be formed, and the sacrificial layers 120 and the sacrificial gate structures 170 may be removed.

The interlayer insulating layer 190 may be formed by forming an insulating layer covering the sacrificial gate structures 170 and the source/drain regions 150 and performing a planarization process.

The sacrificial layers 120 and the sacrificial gate structures 170 may be selectively removed with respect to the spacer layers 161, the interlayer insulating layer 190, and the plurality of channel layers 141, 142, and 143. First, upper gap regions UR may be formed by removing the sacrificial gate structures 170, and then the sacrificial layers 120 exposed through the upper gap regions UR may be removed to form a lower gap regions LR. For example, when the sacrificial layers 120 include silicon germanium (SiGe) and the plurality of channel layers 141, 142, and 143 include silicon (Si), the sacrificial layers 120 may be selectively removed by performing a wet etching process using peracetic acid as an etchant. During the removal process, the source/drain region 150 may be protected by the first epitaxial layer 151 formed at the outermost portion and having a low selective etching ratio.

Figure 4H:
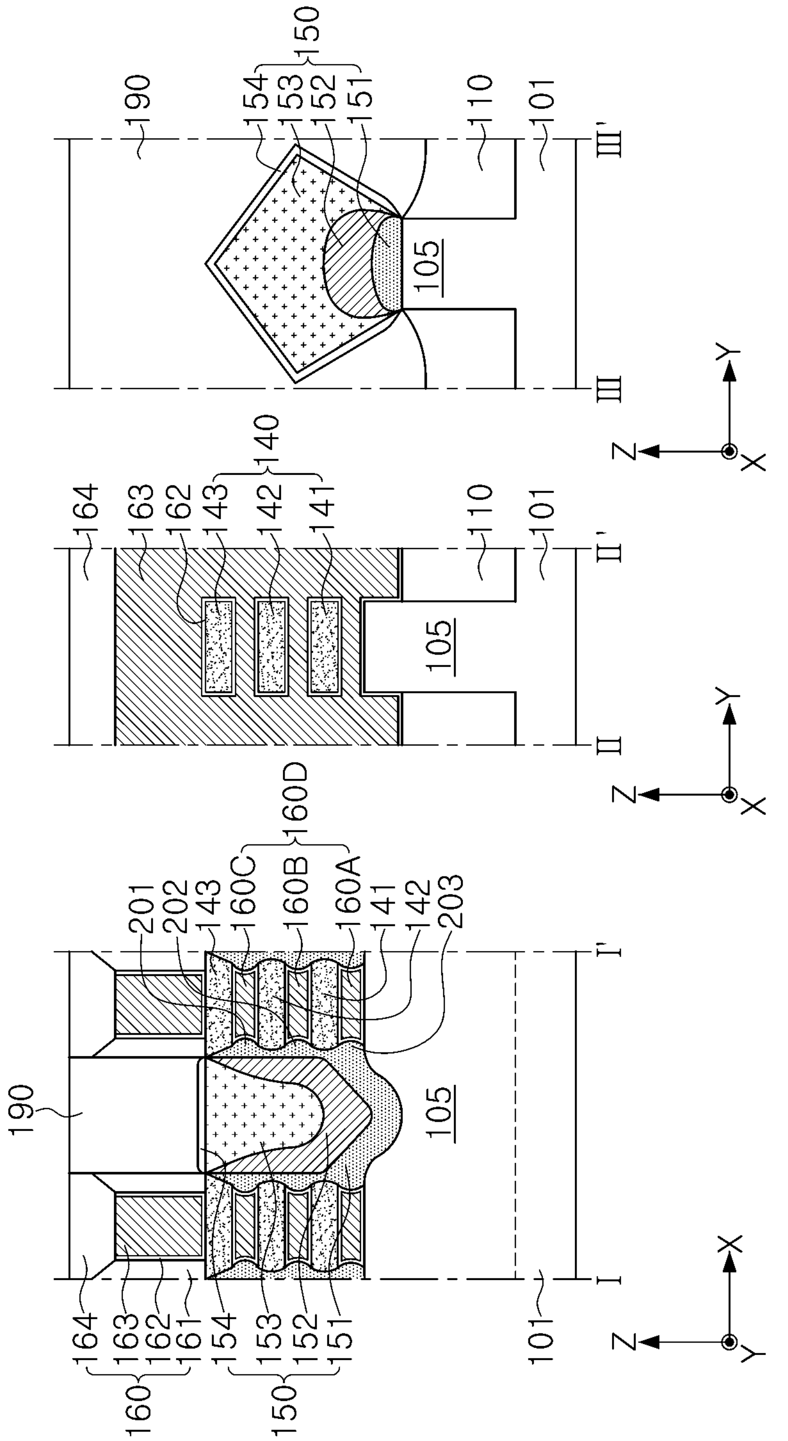

Referring to FIG. 4H, the gate structure 160 may be formed in the upper gap regions UR and the lower gap regions LR.

The gate dielectric layer 162 may be formed to conformally cover inner surfaces of the upper gap regions UR and the lower gap regions LR. The gate electrode layer 163 may be formed to fill the upper gap regions UR and the lower gap regions LR. The gate electrode layer 163 and the spacer layers 161 may be removed by a predetermined depth from the top in the upper gap regions UR. A gate capping layer 164 may be formed in a region in which the gate electrode layer 163 and the spacer layers 161 are removed from the upper gap regions UR. Accordingly, the gate structure 160 including the gate dielectric layer 162, the gate electrode layer 163, the spacer layers 161, and the gate capping layer 164 may be formed.

Figure 4I:
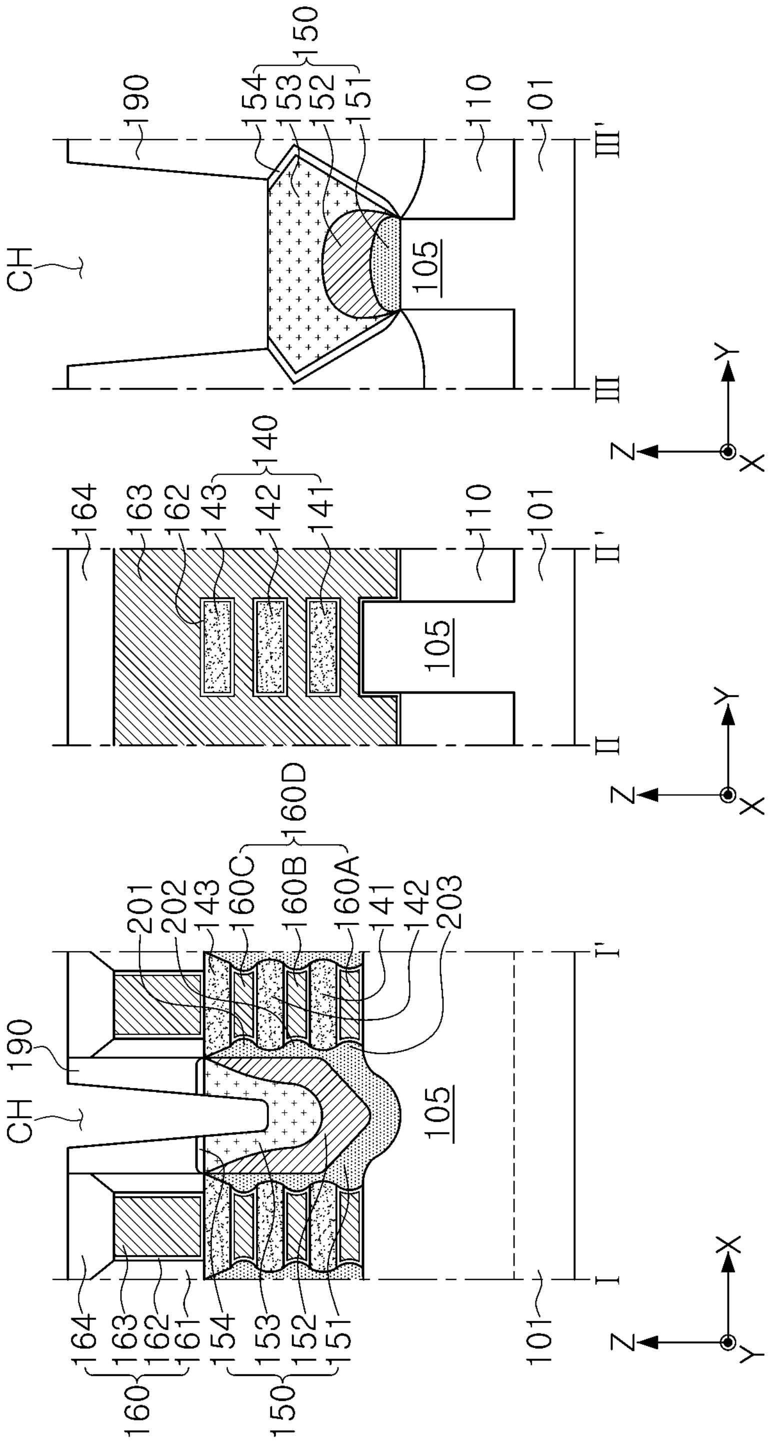

Referring to FIG. 4I, contact holes CH exposing the source/drain region 150 may be formed through the interlayer insulating layer 190, the capping layer 154 and a portion of the third epitaxial layer 153. Lower surfaces of the contact holes CH may be recessed into the source/drain region 150.

Referring back to FIGS. 1, 2A, and 2B, the contact plug 180 may be formed in the contact holes CH. The contact plug 180 may include a metal-semiconductor compound layer 182 disposed at a lower end, a barrier layer 184 disposed along sidewalls, and a plug conductive layer 186.

In an example embodiment, the contact plug 180 may pass through at least a portion of the interlayer insulating layer 190 and may be disposed to contact the source/drain region 150. In this case, the metal-semiconductor compound layer 182 of the contact plug 180 may contact a portion of the source/drain region 150, and the lower end of the metal-semiconductor compound layer 182 may be located on a level lower than the upper end of the plurality of channel layers 141, 142, and 143. However, the shape and arrangement of the contact plug 180 are not limited thereto, and may be variously changed.

A semiconductor device having improved electrical characteristics may be provided by increasing the distance between the high-concentration second epitaxial layer of the source/drain region and the substrate through the lower structure of the first epitaxial layer in the source/drain region.

While aspects of example embodiments have been shown and described, it will be apparent to those skilled in the art that modifications and variations could be made without departing from the scope of the appended claims.

What is claimed is:

1. A semiconductor device comprising:

an active region extending in a first direction on a substrate;

a plurality of channel layers on the active region and spaced apart from each other along a vertical direction, perpendicular to an upper surface of the substrate;

a gate structure extending in a second direction, crossing the active region and the plurality of channel layers on the substrate and enclosing the plurality of channel layers, respectively; and a source/drain region on the active region on at least one side of the gate structure, and contacting the plurality of channel layers, wherein the source/drain region comprises a first epitaxial layer on the active region and extending to contact the plurality of channel layers, and a second epitaxial layer, the first epitaxial layer extending between the plurality of channel layers and the second epitaxial layer, wherein at least a portion of a surface in which the first epitaxial layer and the second epitaxial layer are in contact with each other has first surfaces and second surfaces that face different directions, wherein the surface in which the first epitaxial layer and the second epitaxial layer are in contact with each other comprises first bent portions and a second bent portion, and wherein the second surfaces extend from the first bent portions to the second bent portion, wherein the gate structure comprises a lower gate portion, a middle gate portion on the lower gate portion, and an upper gate portion on the middle gate portion in a region overlapping the plurality of channel layers along the vertical direction, wherein a lower end of the second epitaxial layer is disposed on a level substantially equal to or lower than a level of a lower surface of the lower gate portion of the gate structure along the vertical direction, wherein the first epitaxial layer comprises an upper portion on a level corresponding to a level of a center between an upper surface and a lower surface of the upper gate portion, a middle portion on a level corresponding to a level of a center between an upper surface and a lower surface of the middle gate portion, and a lower portion on a level corresponding to a level of a center between an upper surface and the lower surface of the lower gate portion, wherein each of the upper, middle and lower portions has a horizontal length in the first direction, and a maximal horizontal length of the lower portion along the first direction is greater than a maximal horizontal length of each of the upper portion and the middle portion along the first direction.

2. The semiconductor device of claim 1, wherein each of the second surfaces has a (111) crystal plane.

3. The semiconductor device of claim 1, wherein a lower end of the first epitaxial layer is disposed on a level lower than a level of the lower surface of the lower gate portion.

4. The semiconductor device of claim 1, wherein the portion of the surface in which the first epitaxial layer and the second epitaxial layer are in contact with each other forms a surface that is perpendicular to the substrate.

5. The semiconductor device of claim 1, wherein the horizontal length of the lower portion is in the range of about 11 nm to about 15 nm.

6. The semiconductor device of claim 1, wherein the horizontal length of each of the upper portion and the middle portion is in the range of about 6 nm to about 10 nm.

7. The semiconductor device of claim 1, wherein a difference between the horizontal length of the lower portion and the horizontal length of the upper portion or a difference between the horizontal length of the lower portion and the horizontal length of the middle portion is in the range of about 2 nm to about 9 nm.

8. The semiconductor device of claim 1, further comprising a third epitaxial layer disposed on the second epitaxial layer.

9. The semiconductor device of claim 8, wherein the first epitaxial layer comprises first silicon germanium (SiGe) comprising germanium (Ge) having a first concentration, wherein the second epitaxial layer comprises second silicon germanium (SiGe) comprising germanium (Ge) having a second concentration higher than the first concentration, and wherein the third epitaxial layer comprises third silicon germanium (SiGe) comprising germanium (Ge) having a third concentration higher than the second concentration.

10. The semiconductor device of claim 9, wherein the source/drain region further comprises a capping layer disposed on the third epitaxial layer.

11. The semiconductor device of claim 10, further comprising:

an interlayer insulating layer on the source/drain region; and a contact plug passing through at least a portion of the interlayer insulating layer and contacting the source/drain region.

12. The semiconductor device of claim 11, wherein the contact plug comprises a metal-semiconductor compound layer, and wherein a lower end of the metal-semiconductor compound layer is located on a level lower than an upper end of the plurality of channel layers.

13. A semiconductor device comprising:

an active region extending in a first direction on a substrate;

a plurality of channel layers arranged on the active region and spaced apart from each other along a vertical direction, perpendicular to an upper surface of the substrate;

a gate structure extending in a second direction, crossing the active region and the plurality of channel layers on the substrate, and enclosing the plurality of channel layers, respectively; and a source/drain region on the active region on at least one side of the gate structure and contacting the plurality of channel layers, wherein the source/drain region comprises a first epitaxial layer on the active region and extending to contact the plurality of channel layers, and a second epitaxial layer, the first epitaxial layer extending between the plurality of channel layers and the second epitaxial layer, wherein a surface in which the first epitaxial layer and the second epitaxial layer contact each other comprises:

first surfaces having a first slope;

second surfaces extending from lower portions of the first surfaces and having a second slope, different from the first slope;

first bent portions between the first surfaces and the second surfaces; and a second bent portion in which the second surfaces meet, and wherein the second surfaces have a (111) crystal plane.

14. The semiconductor device of claim 13, wherein the gate structure comprises a lower gate portion, a middle gate portion on the lower gate portion, and an upper gate portion on the middle gate portion in a region overlapping the plurality of channel layers along the vertical direction, wherein the first bent portions are disposed on a level lower than a level of a lower surface of the middle gate portion, and wherein the second bent portion is disposed on a level lower than a level of a center portion of the lower gate portion.

15. The semiconductor device of claim 13, wherein the gate structure comprises a lower gate portion, a middle gate portion on the lower gate portion, and an upper gate portion on the middle gate portion in a region overlapping the plurality of channel layers along the vertical direction, wherein the first bent portions and a lower surface of the middle gate portion are disposed on a substantially similar level, and wherein the second bent portion is disposed on a level corresponding to a level of a center portion of the lower gate portion.

16. The semiconductor device of claim 13, wherein the gate structure comprises a lower gate portion, a middle gate portion on the lower gate portion, and an upper gate portion on the middle gate portion in a region overlapping the plurality of channel layers along the vertical direction, wherein the first bent portions and a lower surface of the middle gate portion are disposed on a substantially similar level, and wherein the second bent portion is disposed on a level lower than a level of a center portion of the lower gate portion.

17. The semiconductor device of claim 13, wherein the gate structure comprises a lower gate portion, a middle gate portion on the lower gate portion, and an upper gate portion on the middle gate portion in a region overlapping the plurality of channel layers along the vertical direction, wherein the first bent portions are disposed on a level higher than a level of a lower surface of the middle gate portion and lower than a level of a center portion of the middle gate portion, and wherein the second bent portion and a center portion of the lower gate portion are disposed on a substantially similar level.

18. The semiconductor device of claim 13, wherein the gate structure comprises a lower gate portion, a middle gate portion on the lower gate portion, and an upper gate portion on the middle gate portion in a region overlapping the plurality of channel layers along the vertical direction, wherein the first bent portions are disposed on a level higher than a level of a lower surface of the middle gate portion and lower than a level of a center portion of the middle gate portion, and wherein the second bent portion is disposed on a level lower than a level of a center portion of the lower gate portion.

19. The semiconductor device of claim 13, wherein the gate structure comprises a lower gate portion, a middle gate portion on the lower gate portion, and an upper gate portion on the middle gate portion in a region overlapping the plurality of channel layers along the vertical direction, and wherein a center portion of the lower gate portion is disposed between the first bent portions and the second bent portion.

20. A semiconductor device comprising:

an active region extending in a first direction on a substrate;

a plurality of channel layers on the active region and spaced apart from each other along a vertical direction, perpendicular to an upper surface of the substrate;

a gate structure extending in a second direction, crossing the active region and the plurality of channel layers on the substrate, and enclosing the plurality of channel layers, respectively; and a source/drain region on the active region on at least one side of the gate structure and contacting the plurality of channel layers, wherein the gate structure comprises a plurality of gate portions overlapping the plurality of channel layers along the vertical direction and spaced apart from each other along the vertical direction, wherein the source/drain region comprises a first epitaxial layer on the active region and extending to contact the plurality of channel layers, and a second epitaxial layer, the first epitaxial layer extending between the plurality of channel layers and the second epitaxial layer, wherein at least a portion of a surface in which the first epitaxial layer and the second epitaxial layer are in contact with each other has a (111) crystal plane, wherein the surface in which the first epitaxial layer and the second epitaxial layer are in contact with each other comprises first bent portions, a second bent portion, and inclined surfaces extending from the first bent portions to the second bent portion, wherein the first epitaxial layer comprises epitaxial portions that correspond to the plurality of gate portions, wherein along the first direction, a widest epitaxial portion, among the epitaxial portions, is a lowermost epitaxial portion, and wherein a maximum width of the lowermost epitaxial portion in the first direction is in the range of about 11 nm to about 15 nm.

* * * * *